(12) United States Patent
Seo et al.

(10) Patent No.: US 10,141,407 B2
(45) Date of Patent: Nov. 27, 2018

(54) GRAPHENE DEVICE AND METHOD OF MANUFACTURING THE SAME

(71) Applicant: Samsung Electronics Co., Ltd., Suwon-Si, Gyeonggi-Do (KR)

(72) Inventors: David Seo, Yongin-si (KR); Ho-jung Kim, Suwon-si (KR); In-kyeong Yoo, Yongin-si (KR); Myoung-jae Lee, Hwaseong-si (KR); Seong-ho Cho, Gwacheon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 198 days.

(21) Appl. No.: 14/506,041

(22) Filed: Oct. 3, 2014

(65) Prior Publication Data

US 2015/0123078 A1    May 7, 2015

(30) Foreign Application Priority Data

Oct. 7, 2013  (KR) .......................... 10-2013-0119443

(51) Int. Cl.
*H01L 27/108* (2006.01)
*H01L 29/66* (2006.01)
(Continued)

(52) U.S. Cl.
CPC ...... *H01L 29/1606* (2013.01); *H01L 27/1052* (2013.01); *H01L 29/66037* (2013.01);
(Continued)

(58) Field of Classification Search
CPC ............... H01L 29/7881; H01L 29/792; H01L 29/1606; H01L 29/49; H01L 27/11529;
(Continued)

(56) References Cited

U.S. PATENT DOCUMENTS 7,064,986 B2    6/2006  Lee et al.
7,262,991 B2    8/2007  Zhang et al.
(Continued)

FOREIGN PATENT DOCUMENTS

CN    101166721 A    4/2008
KR    2011-0081183 A    7/2011
KR    101244768 B1    3/2013

OTHER PUBLICATIONS

Augustin J. Hong et al., "Graphene Flash Memory", Aug. 2011, 6 pages, American Chemical Society.
(Continued)

*Primary Examiner* — Mary Wilczewski
*Assistant Examiner* — Tsz Chiu
(74) *Attorney, Agent, or Firm* — Harness, Dickey & Pierce, P.L.C.

(57) ABSTRACT

According to example embodiments, a graphene device includes a first electrode, a first insulation layer on the first electrode, an information storage layer on the first insulation layer, a second insulation layer on the information storage layer, a graphene layer on the second insulation layer, a third insulation layer on a first region of the graphene layer, a second electrode on the third insulation layer, and a third electrode on a second region of the graphene layer.

12 Claims, 4 Drawing Sheets

(51) Int. Cl.
  *H01L 45/00* (2006.01)
  *H01L 29/16* (2006.01)
  *H01L 29/68* (2006.01)
  *H01L 27/105* (2006.01)
  *H01L 29/76* (2006.01)

(52) U.S. Cl.
  CPC ...... H01L 29/66045 (2013.01); H01L 29/685 (2013.01); *H01L 27/10808* (2013.01); *H01L 29/66015* (2013.01); *H01L 29/7606* (2013.01)

(58) Field of Classification Search
  CPC ......... H01L 27/11551; H01L 29/42324; H01L 29/4908; H01L 29/66045
  USPC ................................................. 257/315, 324
  See application file for complete search history.

(56) References Cited

U.S. PATENT DOCUMENTS

| | | | |
|---|---|---|---|
| 7,403,422 B2 | 7/2008 | Kim et al. | |
| 7,450,433 B2 | 11/2008 | Wan et al. | |
| 7,821,809 B2 | 10/2010 | Yoo et al. | |
| 2007/0014151 A1* | 1/2007 | Zhang | B82Y 10/00 365/185.01 |
| 2012/0032149 A1* | 2/2012 | Chen | B82Y 10/00 257/24 |
| 2012/0168722 A1* | 7/2012 | Chung | H01L 29/1606 257/29 |
| 2012/0248414 A1* | 10/2012 | Kim | B82Y 10/00 257/29 |
| 2012/0281484 A1* | 11/2012 | Cho | G11C 16/0416 365/185.28 |
| 2012/0319096 A1* | 12/2012 | Rinzler | B82Y 10/00 257/40 |
| 2013/0015429 A1* | 1/2013 | Hong | B82Y 10/00 257/29 |

OTHER PUBLICATIONS

"Graphene—Article." http://cafe.naver.com/sanghangacom/5698, Jan. 4, 2012.

Chandan Biswas et al., "Graphene Versus Carbon Nanotubes in Electronic Devices", Wiley Online Library, 2011, pp. 3806-3826, Advanced Functional Materials.

* cited by examiner

US 10,141,407 B2

GRAPHENE DEVICE AND METHOD OF MANUFACTURING THE SAME

RELATED APPLICATIONS

This application claims priority under 35 U.S.C. § 119 to Korean Patent Application No. 10-2013-0119443, filed on Oct. 7, 2013, in the Korean Intellectual Property Office, the disclosure of which is incorporated herein in its entirety by reference.

BACKGROUND

1. Field

The present disclosure relates to graphene devices and/or methods of manufacturing the same, and more particularly, to a graphene device using a graphene gate, and/or a method of manufacturing the graphene device.

2. Description of Related Art

Integration and performance of semiconductor devices including a silicon substrate have been quickly increased. However, improving the performance of silicon-based semiconductor devices may be limited due to material properties of silicon and/or limitations related to manufacturing processes. Accordingly, next-generation devices are being studied.

Graphene has stable electrical/mechanical/chemical characteristics and/or excellent conductivity. Nano-devices using graphene are being studied. Due to its characteristics, graphene is receiving attention as a next-generation material in various fields. Graphene is a material in which carbon atoms are connected in a hexagon on a plane. A thickness of graphene may be as thin as one atom layer. Graphene may conduct electricity 100 times faster than single crystal silicon, and theoretically may have a mobility of 200,000 $cm^2/Vs$. Sine graphene may be able to conduct electricity 100 times more than copper, graphene is receiving attention as a basic material of an electronic circuit.

In detail, graphene may be a zero gap semiconductor material. When a graphene nanoribbon (GNR) having a small sized channel is manufactured, a band gap may be formed according to a size effect, and thus an electric field effect transistor operable at a room temperature may be manufactured.

SUMMARY

Example embodiments relate to graphene devices including a graphene gate.

Example embodiments relate to methods of manufacturing a graphene device including a graphene gate.

Additional aspects will be set forth in part in the description which follows and, in part, will be apparent from the description, or may be learned by practice of example embodiments.

According to example embodiments, a graphene device includes a first electrode; a first insulation layer on the first electrode; an information storage layer on the first insulation layer; a second insulation layer on the information storage layer; a graphene layer on the second insulation layer; a third insulation layer on a first region of the graphene layer; a second electrode on the third insulation layer; and a third electrode on a second region of the graphene layer.

In example embodiments, the graphene layer may have a single film structure.

In example embodiments, the information storage layer may include a charge trapping structure, and the charge trapping structure may be configured to store an electric charge.

In example embodiments, the information storage layer may include a dielectric material layer, and the dielectric material layer may include a high-k material.

In example embodiments, the information storage layer may include a high-k dielectric material layer, the high-k dielectric material layer may further include a compound configured to trap an electric charge in a high-k dielectric material layer, and the compound may include one of metal and silicon.

In example embodiments, the information storage layer may be formed of silicon nitride.

In example embodiments, the information storage layer may be configured to store information in a multi-level.

The third insulation layer may be a gate insulation layer, and the second electrode may be a gate electrode.

According to example embodiments, a method of manufacturing a graphene device includes forming a first insulation layer on a first electrode; forming an information storage layer on the first insulation layer; forming a second insulation layer on the first electrode; forming a graphene layer on the second insulation layer; forming a third insulation layer on a first region of the graphene layer; forming a second electrode on the third insulation layer; and forming a third electrode on a second region of the graphene layer. The method may include forming the first electrode on a substrate or a lower structure.

In example embodiments, the forming the graphene layer may include one of: transferring graphene on the second insulation layer and growing graphene directly on the second insulation layer.

According to example embodiments, a graphene device includes a first electrode; a graphene layer on the first electrode; a second electrode and a third electrode spaced apart from each other on the graphene layer; an insulating layer between the graphene layer and the second electrode; and an information storage layer between the graphene layer and the first electrode. The second electrode is configured to adjust a work function of the graphene layer. The information storage layer is configured to store an electric charge.

In example embodiments, the graphene device may include a first insulation layer between the information storage layer and the first electrode, and may include a second insulation layer between the information storage layer and the graphene layer. A band gap of the first insulation layer may be greater than a band gap of the information storage layer. A band gap of the second insulation layer may be greater than the band gap of the information storage layer. The insulation layer between the graphene layer and the second electrode may be a third insulation layer.

In example embodiments, the graphene layer may be a single film structure.

In example embodiments, the first electrode, second electrode and third electrode may be configured to adjust a capacitance value of the information storage layer based on the setting the first electrode to a ground state and supplying at least one of electrons and holes to the information storage layer according to a power applied to the second and third electrodes.

In example embodiments, the second electrode may be directly on the graphene layer.

BRIEF DESCRIPTION OF THE DRAWINGS

These and/or other aspects of example embodiments will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
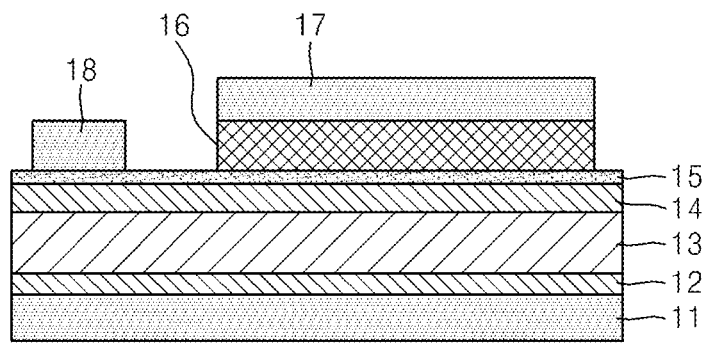
FIG. 1 is a cross-sectional of a graphene device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional of a graphene device according to example embodiments.

Referring to FIG. 1, the graphene device according to example embodiments may include a first electrode 11, a first insulation layer 12 formed on the first electrode, an information storage layer 13 formed on the first insulation layer 12, a second insulation layer 14 formed on the information storage layer 13, a graphene layer 15 formed on the second insulation layer 14, a third insulation layer 16 formed on a first region of the graphene layer 15, and a second electrode 17 formed on the third insulation layer 16. Also, a third electrode 18 may be formed on a second region of the graphene layer 15.

The first electrode 11 may be formed on a substrate (not shown). The substrate may be a semiconductor substrate and/or semiconductor-on-insulator substrate (SOI). For example, the substrate may be formed of at least one of silicon, germanium, silicon-germanium, a III-V group semiconductor, and a II-VI group semiconductor. The first electrode 11 may have a single layer or multi-layer structure formed of a conductive material, such as a metal, an alloy, a conductive metal oxide, or a conductive metal nitride. Examples of a material of the first electrode 11 include platinum (Pt), gold (Au), aluminum (Al), chromium (Cr), copper (Cu), titanium (Ti), tungsten (W), titanium nitride (TiN), and indium tin oxide (ITO), but are not limited thereto. The first electrode 11 may be a bottom contacting layer.

The first insulation layer 12 and the second insulation layer 14 may be respectively formed on two sides of the information storage layer 13, and may be formed of materials having higher energy band gaps than the information storage layer 13 so that carriers, such as electrons or holes may be limited from escaping (and/or do not escape) the information storage layer 13. For example, the first and second insulation layers 12 and 14 may be formed of silicon oxide ($SiO_2$), but example embodiments are not limited thereto. The first and second insulation layers 12 and 14 may be a tunneling oxide layer.

The information storage layer 13 may be a charge trapping layer for storing an electric charge therein. The information storage layer 13 may include a dielectric material layer formed of a high-k material having a higher dielectric constant than silicon oxide. For example, the information storage layer 13 may be formed of silicon nitride. Also, in the information storage layer 13, another material may be included in the dielectric material formed of the high-k material in a trap site. For example, the information storage layer 13 may be a compound further including a metal or silicon to trap an electric charge in a high-k dielectric material layer, such as aluminum oxide ($Al_2O_3$) or silicon nitride ($Si_3N_4$). The information storage layer 13 may include both a compound including metal ($Al_2O_3$) and a compound including silicon ($Si_3N_4$) in a high-k dielectric material layer.

The graphene layer 15 may be formed on the second insulation layer 14, and may be formed by transferring graphene on the second insulation layer 14 via chemical vapor deposition (CVD) method, or by directly growing graphene on the second insulation layer 14. The second insulation layer 14 may have a flat surface, and the graphene layer 15 may be formed thereon. In graphene, a plurality of carbon atoms may be connected to each other in a mutual covalent bond to form polycyclic aromatic molecules. As such, carbon atoms connected in a covalent bond may form 6 rings as a basic repeating unit, or may further include 5 rings and/or 7 rings. The graphene layer 15 may be formed of graphene having a single layer structure. The graphene layer 15 may operate as a passage through which carriers, such as electrons or holes, move. A thickness of the graphene layer 15 may be about 0.3 nm.

The third insulation layer 16 may be formed on the first region of the graphene layer 15, and may be formed of silicon oxide or a high-k material having a higher dielectric constant than silicon oxide. The third insulation layer 16 may be formed of silicon oxide, silicon nitride, aluminum oxide, or hafnium oxide. The third insulation layer 16 may have a single layer or multi-layer structure. The third insulation layer 16 may be a gate insulation layer (gate oxide layer). A thickness of the third insulation layer 16 may be about 3 nm to 20 nm, but is not limited thereto.

The second electrode 17 may be formed on the third insulation layer 16, and may include a conductive material. The second electrode 17 may be formed of a metal, an alloy, a conductive metal oxide, and/or conductive metal nitride. For example, the second electrode 17 may be formed of Pt, Au, Al, Cr, Cu, Ti, W, TiN, or ITO. However, a material of the second electrode 17 is not limited as long as it is a conductive material. The second electrode 17 may be a gate electrode.

The third electrode 18 may be formed on the second region of the graphene layer 15, and may be formed of a conductive material, such as a metal, an alloy, conductive metal oxide, or conductive metal nitride. For example, the third electrode 18 may be formed of Pt, Au, Al, Cr, Cu, Ti, W, TiN, or ITO, but is not limited thereto. The third electrode 18 may be a graphene contact layer. The second region and the first region may be different regions. The third electrode 18 may be directly formed on the graphene layer 15 to supply electrons or holes to the graphene layer 15.

Figure 2A:
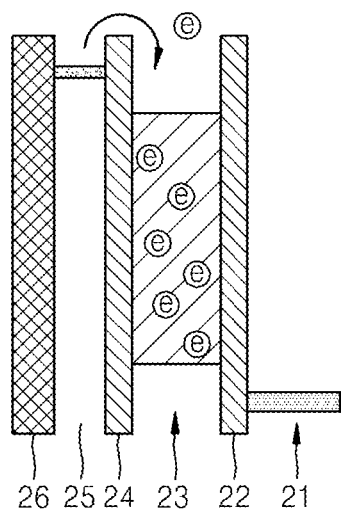
FIGS. 2A and 2B are energy band diagrams for describing operations of writing and erasing information on and from an information storage layer of a graphene device, according to example embodiments.
Figure 2B:
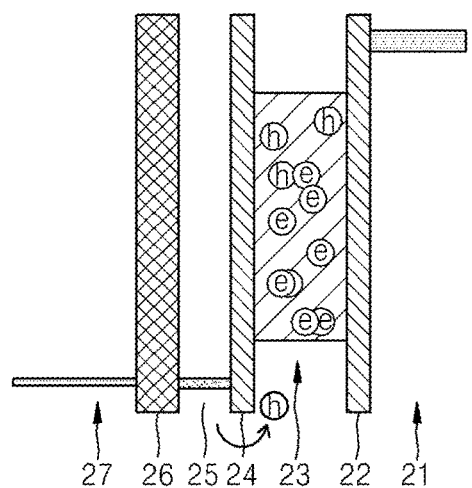

Hereinafter, a method of writing and erasing information of a graphene device, according to example embodiments will now be described with reference accompanying drawings. FIGS. 2A and 2B are energy band diagrams for describing operations of writing and erasing information on and from an information storage layer of a graphene device, according to example embodiments.

Referring to FIGS. 1 and 2A, reference numerals 21, 22, 23, 24, 25, and 26 of FIG. 2A respectively denote energy bands of the first electrode 11, first insulation layer 12, information storage layer 13, second insulation layer 14, graphene layer 15, and third insulation layer 16. If information is to be written on the information storage layer 13, the first electrode 11 is set to a ground state, and power is applied through the second and third electrodes 17 and 18. The second electrode 17 may be a gate electrode and power applied through the second electrode 17 may be a gate voltage. A work function of the graphene layer 15 may be adjusted by the power applied through the second electrode 17, and a Fermi level of the graphene layer 15 may be increased. Also, electrons e supplied from the third electrode 18 to the graphene layer 15 may be injected into the information storage layer 13 over an energy barrier 24 of the second insulation layer 14 (hot electron injection) or via tunneling. Since the Fermi level of the graphene layer 15 is high according to the power applied through the second electrode 17, the electrons e of the graphene layer 15 easily go over the energy barrier 24 of the second insulation layer 14. The electrons e injected into the information storage layer 13 from the graphene layer 15 over or through the second insulation layer 14 may be electrons transferred not only from the third electrode 18 but also from the second electrode 17. The electrons e injected into the information storage layer 13 as such may be stored in the information storage layer 13, and thus information may be written.

Figure 3A:
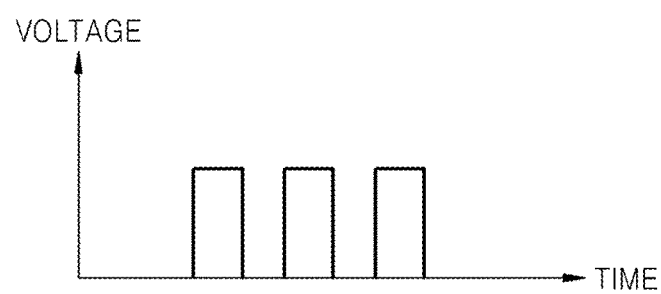
FIGS. 3A and 3B are graphs of a bias voltage applied to a graphene device, according to example embodiments.
Figure 3B:
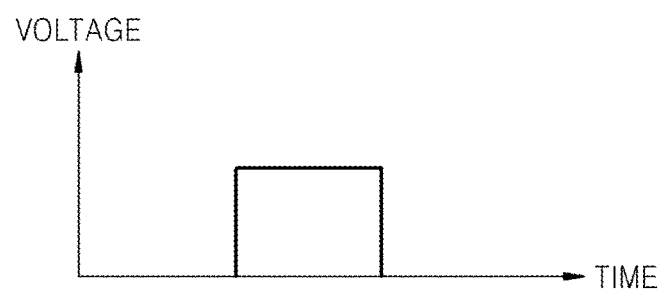

FIGS. 3A and 3B are graphs of a bias voltage applied to a graphene device, according to example embodiments. Here, the applied bias voltage may be a voltage applied to the graphene layer 15 through the third electrode 18. As shown in FIG. 3A, a desired (and/or alternatively predetermined) unit bias voltage may be applied to a graphene device a plurality of times, or as shown in FIG. 3B, a bias voltage may be constantly applied for a long period of time. By controlling a bias voltage applied to the graphene layer 15 as such, an amount of electrons e injected into the information storage layer 13 may be adjusted, and a state of information may be controlled according to the amount of electrons e injected into the information storage layer 13. In other words, a graphene device having multi-level memory characteristics may be realized.

Figure 4:
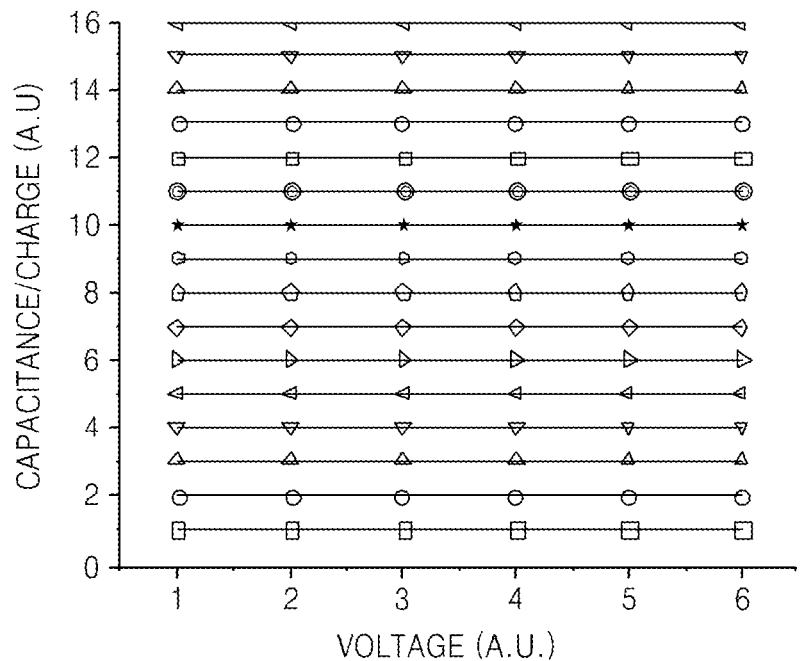
FIG. 4 is a graph showing a memory state stored in a multi-level in an information storage layer of a graphene device, according to example embodiments.

In order to read information written on the information storage layer 13, a capacitance value of the information storage layer 13 is measured. Capacitance of the information storage layer 13 may be measured while maintaining the second electrode 17 to be in a ground state. FIG. 4 is a graph showing a memory state stored in a multi-level in the information storage layer 13 of the graphene device, according to example embodiments. Referring to FIG. 4, the capacitance of the information storage layer 13 may show 16 states, but the number of states is not limited thereto. In FIG. 4, the voltage in the x-axis may be a difference in the voltages applied to the second and third electrodes 17 and 18 in FIG. 1.

Next, a method of erasing information of the information storage layer 13 will be described.

Referring to FIGS. 1 and 2B, when information of the information storage layer 13 is to be erased, the first electrode 11 is set to a ground state, and power is applied through the second and third electrodes 17 and 18. Here, the power applied through the second and third electrodes 17 and 18 may be a voltage having an opposite polarity from the voltage applied to write information. The work function of the graphene layer 15 may be adjusted according to the power applied through the second electrode 17, and the Fermi level of the graphene layer 15 may be decreased. Also, holes h supplied from the third electrode 18 to the graphene layer 15 may be injected into the information storage layer 13 over or through the energy barrier 24 of the second insulation layer 14. When the holes h are injected into the information storage layer 13, the holes h combine with the electrons e of the information storage layer 13, and thus the electrons e of the information storage layer 13 may be removed. As such, the information of the information storage layer 13 may be erased.

FIGS. 5A through 5D are diagrams for describing a method of manufacturing a graphene device, according to example embodiments. The method may unlimitedly use physical vapor deposition (PVD) or CVD.

Figure 5A:
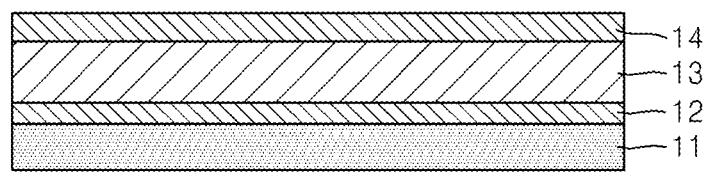
FIGS. 5A through 5D are diagrams for describing a method of manufacturing a graphene device, according to example embodiments.

Referring to FIG. 5A, the first electrode 11, the first insulation layer 12, the information storage layer 13, and the second insulation layer 14 are sequentially formed on a substrate or lower structure. The substrate or lower structure may be formed of a material selected from the group consisting of silicon, germanium, silicon-germanium, a III-V group semiconductor, and II-VI group semiconductor. In order to form the first electrode 11, a conductive material, such as a metal, an alloy, conductive metal oxide, or conductive metal nitride, may be coated on the substrate or lower structure. Then, the first insulation layer 12 may be formed by coating an insulation material, such as silicon oxide, on the first electrode 11, and the information storage layer 13 may be formed by forming a dielectric material layer formed of a high-k material having a higher dielectric constant than silicon oxide on the first insulation layer 12. Then, the second insulation layer 14 may be formed by coating an insulation material, such as silicon oxide, on the information storage layer 13.

Figure 5B:
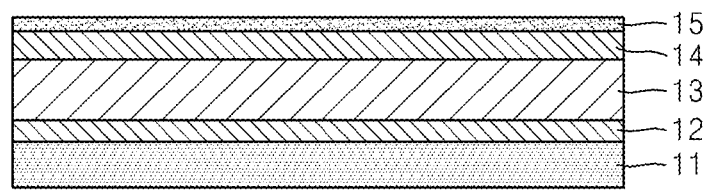

Referring to FIG. 5B, the graphene layer 15 is formed on the second insulation layer 14. Graphene may be formed via CVD. The graphene layer 15 may be formed by transferring already-formed graphene on the second insulation layer 14, or directly growing graphene on the second insulation layer 14.

Figure 5C:
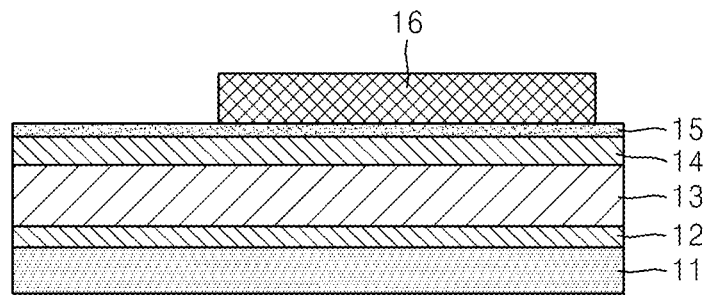

Referring to FIG. 5C, the third insulation layer 16 is formed by coating silicon oxide or a high-k material having a higher dielectric constant than silicon oxide on the first region of the graphene layer 15. The third insulation layer 16 may have a single layer structure or a multi-layer structure of different materials.

Figure 5D:
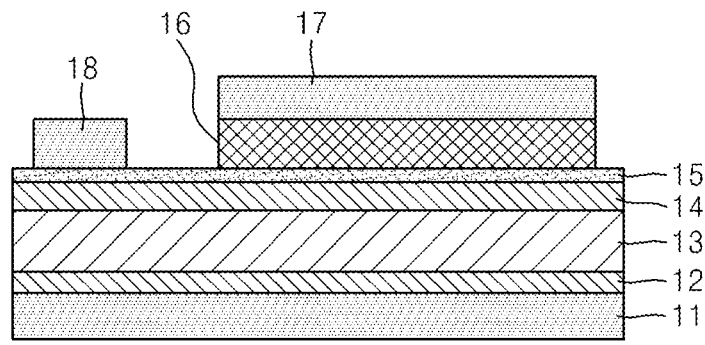

Referring to FIG. 5D, the second electrode 17 is formed on the third insulation layer 16 by using a conductive material, and the third electrode 18 is formed on the second region of the graphene layer 15 by using a conductive material. Examples of materials of the second and third electrodes 17 and 18 unlimitedly include Pt, Au, Al, Cr, Cu, Ti, W, TiN, and ITO. The second and third electrodes 17 and 18 may be selectively formed of the same conductive material.

Since a graphene device according to example embodiments has multi-level characteristics, the graphene device may be used in a synapse circuit structure for a low voltage operation, and may be applied to various logic circuits, memory circuits, and pixel circuits of displays.

As described above, according to the one or more of the above example embodiments, a graphene device having a lower operation voltage and high reliability may be provided. Also, a graphene device having multi-level characteristics may be provided. Since a graphene device according to example embodiments has a low operation voltage and multi-level characteristics, the graphene device may be used in a synapse circuit structure for a low voltage operation.

While one or more graphene device according to example embodiments and/or method of manufacturing thereof have been described, it will be understood by those of ordinary skill in the art that various changes in form and details may be made therein without departing from the spirit and scope of the claims.

What is claimed is:

1. A graphene device comprising:
   a first electrode;
   a first insulation layer on the first electrode;
   an information storage layer on the first insulation layer;
   a second insulation layer on the information storage layer;
   a graphene layer on the second insulation layer;
   a third insulation layer on a first region of the graphene layer;
   a second electrode on the third insulation layer; and
   a third electrode formed on a second region of the graphene layer,
   wherein the third insulation layer and the third electrode are directly formed on a same surface of the graphene layer, the third electrode and the third insulation layer are spaced apart from each other on top of a same surface of the graphene layer, and
   wherein the information storage layer is configured to store an electric charge and includes a high-k dielectric material layer.

2. The graphene device of claim 1, wherein the graphene layer is a single film structure.

3. The graphene device of claim 1, wherein
   the information storage layer further includes a compound configured to trap an electric charge in the high-k dielectric material layer, and
   the compound includes one of metal and silicon.

4. The graphene device of claim 1, wherein the information storage layer includes silicon nitride.

5. The graphene device of claim 1, wherein the information storage layer is configured to store information in a multi-level.

6. The graphene device of claim 1, wherein
   the third insulation layer is a gate insulation layer, and
   the second electrode is a gate electrode.

7. The graphene device of claim 1, wherein
the first to third electrodes are each independently one of a metal, a metal alloy, a conductive metal oxide, and a conductive metal nitride,
the first and second insulation layers include silicon oxide,
the third insulating layer include one of silicon oxide and a high-k material, and
the information storage layer includes a dielectric material having a higher dielectric constant than silicon oxide.

8. A graphene device comprising:
a first electrode;
a graphene layer on the first electrode;
a second electrode and a third electrode spaced apart from each other on the graphene layer, the third electrode being directly formed on the graphene layer;
an insulation layer between the graphene layer and the second electrode, the second electrode being configured to adjust a work function of the graphene layer; and
an information storage layer between the graphene layer and the first electrode, the information storage layer configured to store an electric charge,
wherein the insulation layer and the third electrode are directly formed on a same surface of the graphene layer, the third electrode and the insulation layer are spaced apart from each other on top of a same surface of the graphene layer, and
wherein the information storage layer includes a high-k dielectric material layer.

9. The graphene device of claim 8, further comprising:
a first insulation layer between the information storage layer and the first electrode; and
a second insulation layer between the information storage layer and the graphene layer, wherein
a band gap of the first insulation layer is greater than a band gap of the information storage layer,
a band gap of the second insulation layer is greater than the band gap of the information storage layer, and
the insulation layer between the graphene layer and the second electrode is a third insulation layer.

10. The graphene device of claim 8, wherein the graphene layer is a single film structure.

11. The graphene device of claim 8, wherein the first electrode, second electrode, and third electrode are configured to adjust a capacitance value of the information storage layer based on setting the first electrode to a ground state and supplying at least one of electrons and holes to the information storage layer according to a power applied to the second and third electrodes.

12. The graphene device of claim 8, wherein
the graphene layer is a contiguous layer, and
the information storage layer includes a dielectric material having a higher dielectric constant than silicon oxide.

* * * * *